(12) United States Patent
Frodsham et al.

(10) Patent No.: US 7,386,773 B2
(45) Date of Patent: Jun. 10, 2008

(54) METHOD AND SYSTEM FOR TESTING DISTRIBUTED LOGIC CIRCUITRY

(75) Inventors: Tim Frodsham, Portland, OR (US); Lakshminarayan Krishnamurty, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 335 days.

(21) Appl. No.: 11/024,503

(22) Filed: Dec. 28, 2004

(65) Prior Publication Data

US 2006/0156101 A1 Jul. 13, 2006

(51) Int. Cl.
*G01R 31/28* (2006.01)

(52) U.S. Cl. .................. 714/724; 327/276; 327/393
(58) Field of Classification Search .............. None
See application file for complete search history.

(56) References Cited

U.S. PATENT DOCUMENTS

| | | | | |
|---|---|---|---|---|
| 4,680,760 A | * | 7/1987 | Giles et al. ................ 714/718 |
| 4,926,363 A | * | 5/1990 | Nix ............................ 702/120 |
| 5,272,729 A | * | 12/1993 | Bechade et al. ............ 375/371 |
| 6,006,347 A | * | 12/1999 | Churchill et al. ........... 365/201 |
| 6,301,191 B1 | * | 10/2001 | Ooishi ........................ 365/233 |
| 6,857,092 B1 | * | 2/2005 | Fox ............................. 714/733 |
| 6,958,634 B2 | * | 10/2005 | Rashid ........................ 327/141 |
| 6,967,516 B2 | * | 11/2005 | Okayasu ..................... 327/276 |
| 6,995,554 B2 | * | 2/2006 | Loke et al. ............... 324/76.54 |
| 7,061,224 B2 | * | 6/2006 | Kakizawa et al. ........ 324/76.54 |
| 7,123,075 B2 | * | 10/2006 | Iorga .......................... 327/530 |
| 2003/0210030 A1 | * | 11/2003 | Korger et al. ........... 324/76.54 |
| 2004/0066223 A1 | * | 4/2004 | Tang .......................... 327/276 |
| 2004/0252703 A1 | * | 12/2004 | Bullman et al. ........ 370/395.52 |
| 2005/0149896 A1 | * | 7/2005 | Madurawe .................. 716/17 |
| 2006/0018265 A1 | * | 1/2006 | Frodsham et al. .......... 370/249 |
| 2006/0020861 A1 | | 1/2006 | Frodsham et al. |
| 2006/0115016 A1 | * | 6/2006 | Chen et al. ................. 375/295 |

* cited by examiner

*Primary Examiner*—Jacques Louis-Jacques
*Assistant Examiner*—Steven D Radosevich
(74) *Attorney, Agent, or Firm*—Trop, Pruner & Hu, P.C.

(57) ABSTRACT

A testing procedure for distributed logic circuits that incorporates an efficient utilization of flip-flops to toggle detect for sensing output is discussed. The distributed logic circuit is a phase interpolator or a phase interpolator preceded by a DLL. The testing procedure utilizes enabling one of a plurality of independent programmable current sources and a flip-flop to toggle in response to the enabled current source to indicate a physical connection of the enabled distributed logic circuit current source.

42 Claims, 5 Drawing Sheets

METHOD AND SYSTEM FOR TESTING DISTRIBUTED LOGIC CIRCUITRY

BACKGROUND OF THE INVENTION

1. Field of the Invention

The present invention relates to testing distributed logic and analog circuits, such as, circuitry in phase interpolators and delay locked loops (DLL).

2. Description of the Related Art

As the technology for manufacturing integrated circuits advances, more logic functions are included in a single integrated circuit device or a system on a chip (SoC). Modern integrated circuit (IC) devices include large numbers of gates on a single semiconductor chip, with these gates interconnected so as to perform multiple and complex functions. The fabrication of an IC incorporating such Very Large Scale Integration (VLSI) must be error free, as a manufacturing defect may prevent the IC from performing all of the functions that an IC or SoC is designed to perform. Such demands require verification of the design of the IC or SoC and also various types of electrical testing after the IC or SoC is manufactured.

However, as the complexity of the ICs and SoCs increase, so does the cost and complexity of verifying and electrically testing the individual IC or multiple ICs in a system for a SoC. Testing and manufacturing costs and design complexity increase dramatically not only because of the increasing number of functional pins on the integrated devices and SoC, but because of the increasing complexity of both the analog and digital circuitry supporting each pin.

Likewise, Input/Output (I/O) circuitry may be self tested during various phases of circuit test from wafer sort to platform validation. At various states of test, IO pads may not be contacted by a tester. Nonetheless, test equipment needs to detect manufacturing defects. Typically, additional circuitry or sensing or customized testing patterns are needed.

BRIEF DESCRIPTION OF THE SEVERAL VIEWS OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION OF THE INVENTION

A method and system for toggle detection to sense output for testing distributed logic circuitry within an integrated device or SoC are described. In the following description, for purposes of explanation, numerous details are set forth in order to provide a thorough understanding of the present invention. However, it will be apparent to one skilled in the art that these specific details are not required in order to practice the present invention.

An area of current technological development relates to reducing test complexity and cost. As previously described, DFT methods facilitate the testing of ICs and SoCs. However, present testing methods require additional circuitry, sensing or customized testing patterns. In contrast, a method and system to test distributed logic devices that incorporates an efficient utilization of flip flops to toggle detect for sensing output is discussed. In one embodiment, the distributed logic device is a phase interpolator. In another embodiment, the distributed logic device is a phase interpolator preceded by a DLL. In yet another embodiment, the distributed logic device is any of the following: equalizing current mode or voltage mode transmitters, Impedance controlled termination or drivers, VOC sense amps, or any device with a plurality of legs that may be enabled individually.

Figure 1:
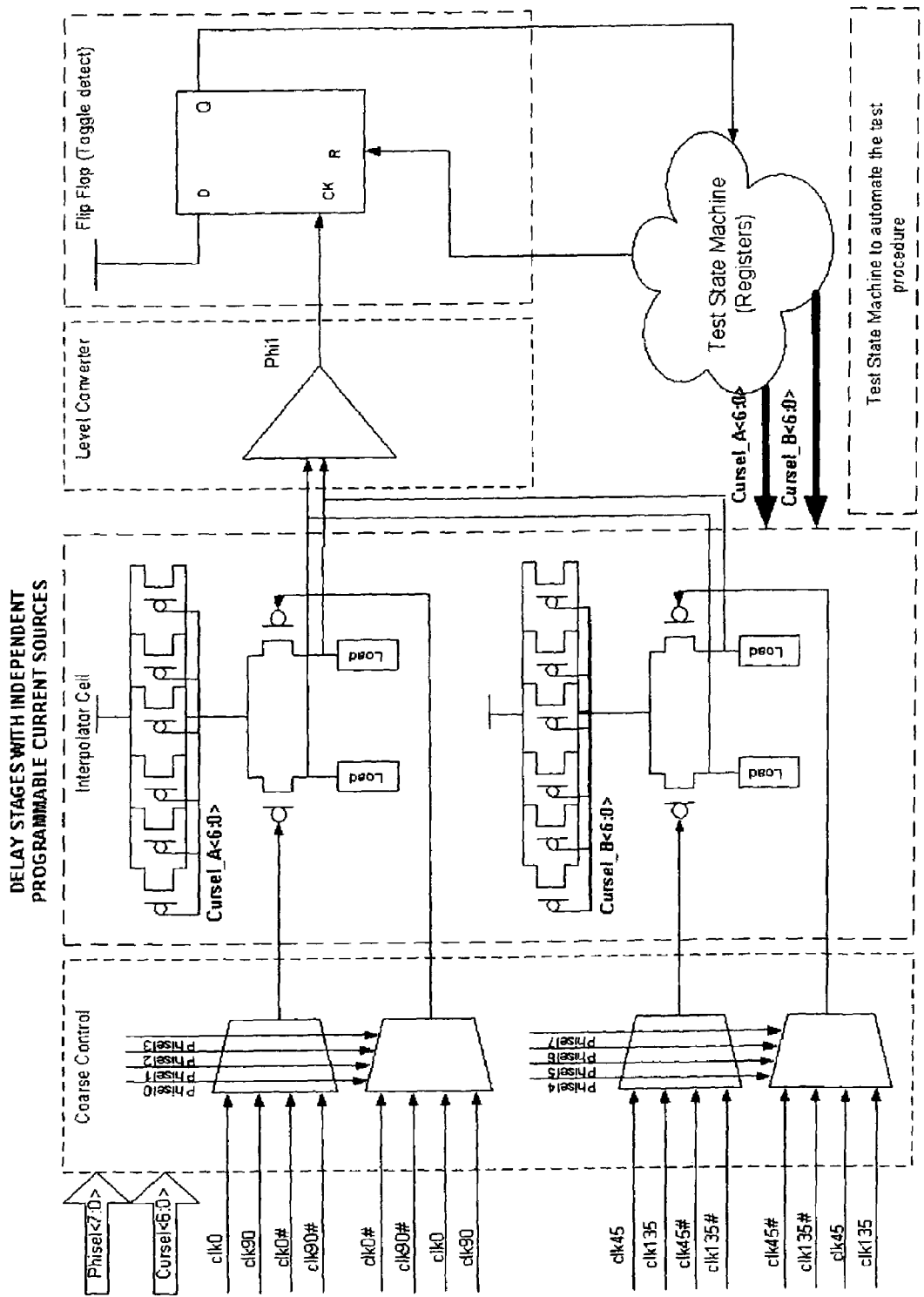
FIG. 1 illustrates a schematic diagram utilized by an embodiment.

FIG. 1 illustrates a schematic diagram utilized by an embodiment. The diagram allows one to test an interpolator cell to make sure that each individual path in the course control multiplexer (shown in connection with FIG. 4) as well as each individual paths in the interpolator cell are functional. For example, the schematic shows a two prong test by allowing a coarse control and to test individual current source paths. The coarse control is discussed in further detail in connection with FIG. 4. In this schematic, two of the four available phases are selected and each current source leg is individually enabled.

To facilitate the explanation of the claimed subject matter, a phase interpolator which receives two fixed input clocks (reference edges) and interpolates between them to generates one edge. Furthermore, the 2 inputs are introduced the fine control section of the interpolator to identical delay stages whose outputs are shorted. The amount of interpolation, resolution, is determined by the currents flowing each branch. The phase interpolator produces a different delay for each setting (programmable delay) by selectively turning on and off the multiple current sources. In one embodiment, the current sources use p-channel metal-oxide semiconductor (PMOS) devices which are biased in saturation.

As previously discussed, FIG. 1 depicts delay stages. In one embodiment, each delay stage has seven bits of control to program the number of current sources being turned ON and OFF. Each such setting produces different amounts of current through the delay stages and thereby produces different delay (or interpolation) between the two input reference edges. During a normal operation mode (for the interpolator to produce the output in the middle of the 2 reference edges) in this implementation, the cursel_A bits are always inverted versions of the cursel_B bits. The shorted output is passed through a level converter and finally goes as a clock input to a flip-flop.

To discuss a test procedure for one embodiment, a first action is for all the current sources (cursel_A and cursel_B) are put in the "OFF" position with the inputs clocks turned on and active. Consequently, no current flows through the delay cells—the shorted output node is held in the low state by the loads—and the flop is reset.

Subsequently, a next action (where both sets of selA and selB are forcibly turned OFF) an current source leg is enabled, "ON", by programming cursel_A to 10000000, while cursel_B is 01111111. Consequently, this produces a clock output at the output buffer—which toggles the output of the flip-flop—immediately signaling that the particular current source leg is physically connected to the circuit.

Subsequently, a next action is to reset the flip-flop and then turn OFF the previous current source leg and enable ON another current source leg by programming cursel_A to 01000000, while cursel_B is 10111111.

By cycling through the previously discussed test procedure for all the current source legs and sensing the output of the flop for a toggle, each current source leg is tested to determine proper physical connections.

In one embodiment, the test procedure can also be automated by means of a simple test state machine—by automatically controlling the programming the cursel bits and observing the output of the flip-flop for a toggle. Each time a current source leg is turned ON and a toggle is observed at the output of the flop—it sets a bit in a status register. The test is then repeated for each of the current sources and every time the status register is updated. In this embodiment, the number of bits in the status register is equivalent to the number of current source legs to be checked. Consequently, in one embodiment for design validation, the values stored in the status register can be read to determine the current source legs on the interpolator that were active and functional. In contrast, in another embodiment for high volume manufacturing, one single register bit is used to determine a general pass fail test function for all of the current source legs.

Figure 2:
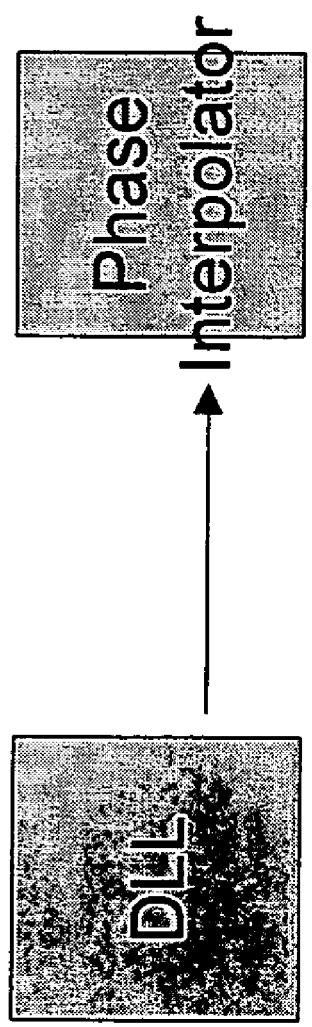
FIG. 2 illustrates a schematic diagram utilized by an embodiment.

FIG. 2 illustrates a schematic diagram utilized by an embodiment. In this embodiment, a DLL is used to produce reference edges to the Phase interpolator. In this embodiment, the test procedure previously discussed in connection with FIG. 1 is used to determine whether the DLL is producing the correct reference edges without loading the DLL outputs. The DLL is discussed in further detail in connection with FIG. 3 and allow for the DLL phase outputs to be tested in conjunction with the phase interpolator.

Figure 3:
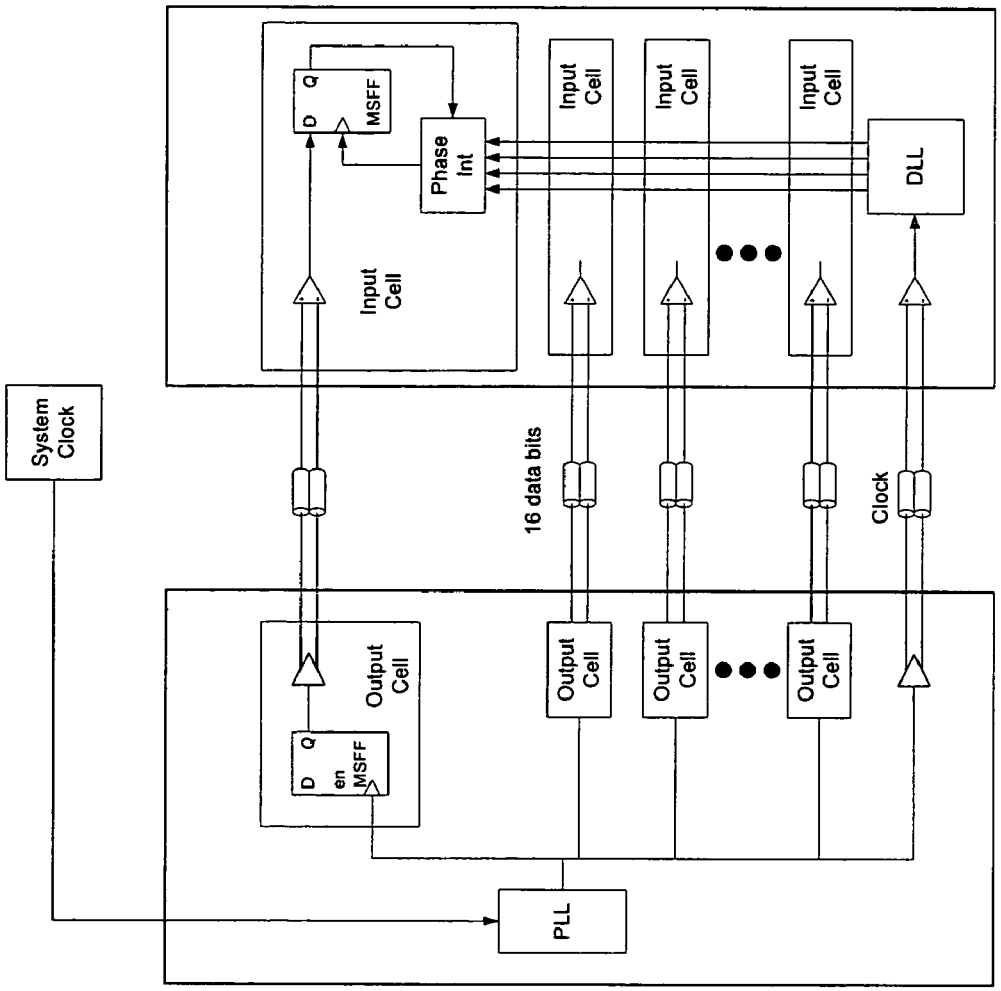
FIG. 3 illustrates a schematic diagram utilized by an embodiment.

FIG. 3 illustrates a schematic diagram utilized by an embodiment. The operation of the schematic diagram allows for a per bit timing deskew. Specifically, a clock is to be centered in the middle of an eye of each individual data channel and results in calibrating out all of the skew in the channel. The forwarded clock feeds a DLL that provides four equally spaced differential phases (that are shown in connection with FIG. 4). Subsequently, in one embodiment, a phase interpolator at each receiver is trained in 5pS increments until the clock at the receiver latch is centered in the data eye. However, the claimed subject matter is not limited to 5 ps increments and supports different time increments based on the particular design.

Figure 4:
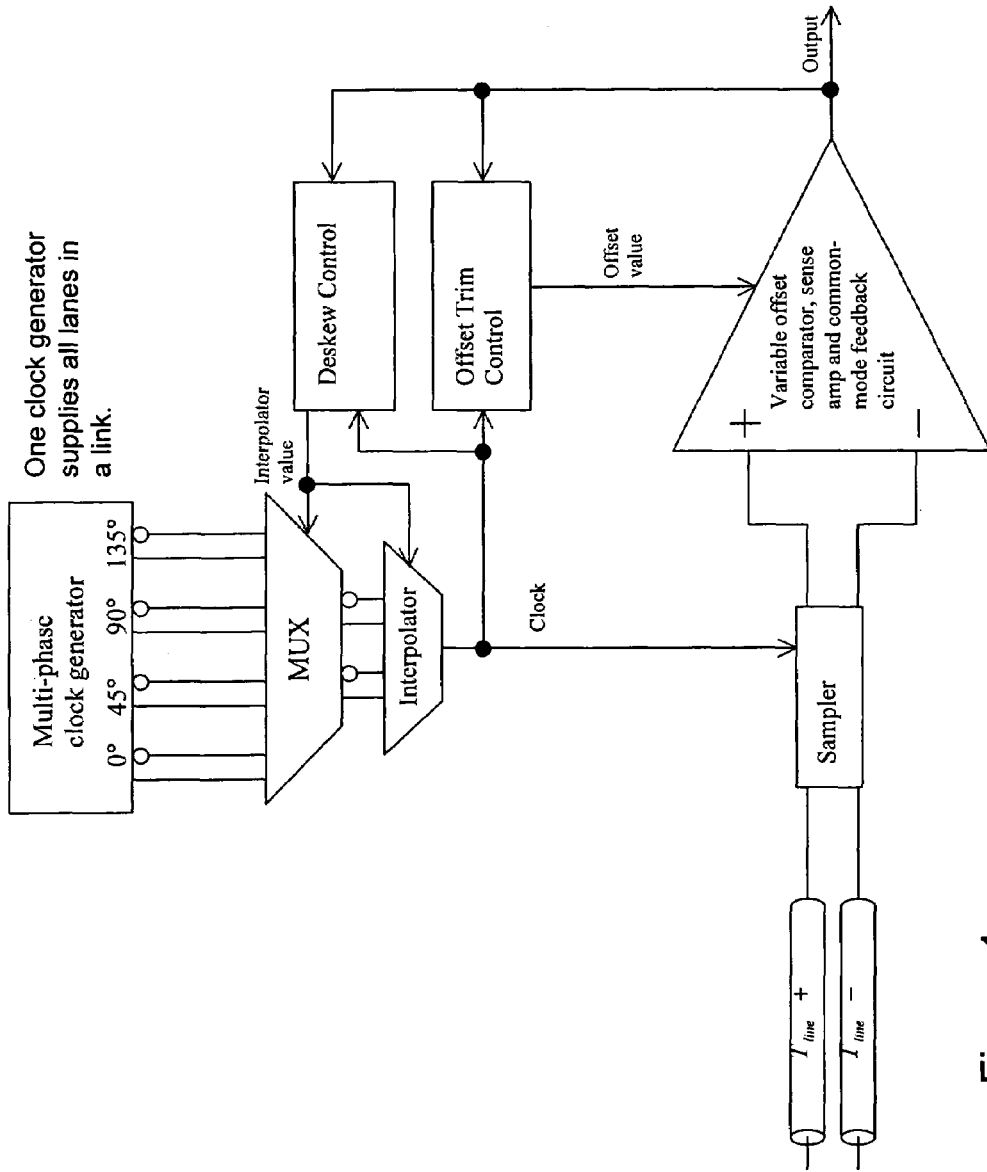
FIG. 4 illustrates a schematic diagram utilized by an embodiment.

FIG. 4 illustrates a schematic diagram utilized by an embodiment. In this embodiment, the clock generator supplies all lanes in a link. As previously discussed, the multiplexer selects two of the four available phases and are used as the coarse control (depicted in connection with FIG. 1). For each two-phase selection, each of the current source legs (in FIG. 1) is enabled. In one embodiment, one may select each current source leg for every possible phase selection. In contrast, in another embodiment, one may select each current source leg for only one selection of two phases. Also, the same test procedure may be used for the offset trim control.

Figure 5:
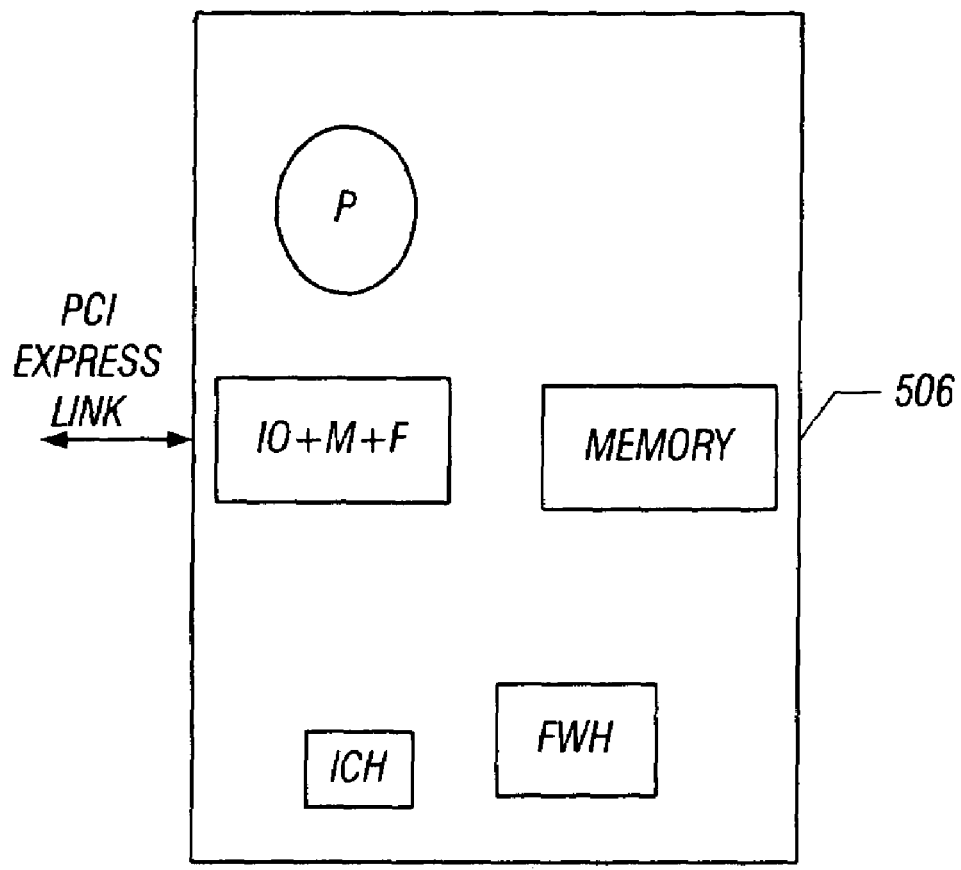
FIG. 5 illustrates a system utilized by an embodiment.
Figure 5:
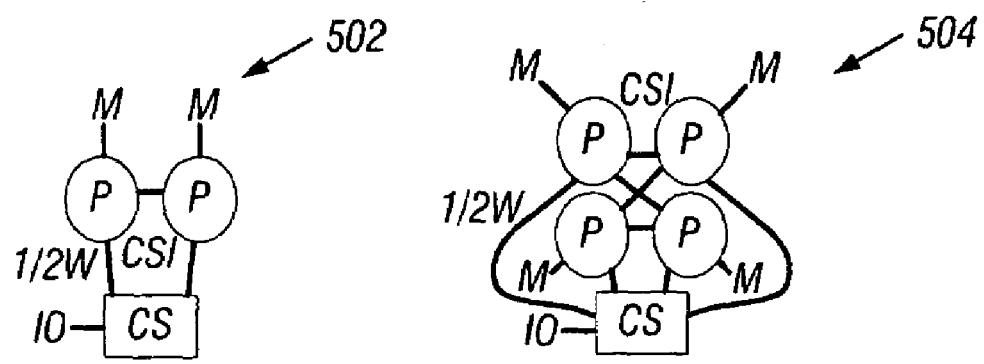

FIG. 5 illustrates a system utilized by an embodiment. In one embodiment, the test procedure and schematics discussed in the preceding figures is used for a point to point interconnect system with a serial interface. The claimed subject matter comprises several embodiments, one with one processor 506, one with two processors (P) 502 and one with four processors (P) 504. In embodiments 502 and 504, each processor is coupled to a memory (M) and is connected to each processor via a network fabric may comprise either or all of: a link layer, a protocol layer, a routing layer, a transport layer, and a physical layer. The fabric facilitates transporting messages from one protocol (home or caching agent) to another protocol for a point to point network. For embodiment 506, the uni-processor P is coupled to graphics and memory control, depicted as IO+M+F, via a network fabric link that corresponds to a layered protocol scheme. The graphics and memory control is coupled to memory and is capable of receiving and transmitting via PCI Express Links. Likewise, the graphics and memory control is coupled to the ICH. Furthermore, the ICH is coupled to a firmware hub (FWH) via a LPC bus. Also, for a different uni-processor embodiment, the processor would have external network fabric links. The processor may have multiple cores with split or shared caches with each core coupled to a Xbar router and a non-routing global links interface. Thus, the external network fabric links are coupled to the Xbar router and a non-routing global links interface.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

The invention claimed is:

1. A method for testing a distributed circuit comprising:
   disabling the distributed circuit via disabling a plurality of current sources by enabling a plurality of input clocks that results in no current flowing through a plurality of delay cells;
   enabling one leg of the distributed circuit; and
   determining whether an output of a flip flop has toggled in response to the enabling one leg of the distributed circuit.

2. The method of claim 1 wherein the distributed circuit is either a logic or analog circuit of the following types:
   a distributed current source, equalizing current mode or voltage mode transmitters, impedance controlled termination or drivers, or VOC sense amps.

3. The method of claim 1 wherein enabling one leg of the distributed circuit is done by programming inverse values for a first and second set of control bits.

4. An apparatus to test a distributed circuit Comprising:
   a first plurality of delay stages with first independent programmable current sources;
   a second plurality of delay stages with second independent programmable current sources;
   a first plurality of control bits to enable the first independent programmable current sources and a second plurality of control bits to enable the second independent programmable current sources, wherein the second plurality of control bits are to be generated having inverse values to the values of the first plurality of control bits; and
   a flip flop to toggle in response to one of the independent programmable current sources being enabled.

5. The apparatus of claim 4 wherein the independent programmable current sources utilize PMOS circuits which are biased in saturation.

6. The apparatus of claim 4 wherein the first plurality of control bits enable one of the first independent programmable current sources that results in a clock output at an output buffer that toggles an output of the flip flop during normal operation of the enabled current source to indicate it is physically connected.

7. The apparatus of claim 4 wherein the distributed circuit is either one of a phase interpolator or a DLL coupled to a phase interpolator.

8. An apparatus to test a distributed logic circuit comprising:
a plurality of delay stages with independent programmable current sources;
a plurality of control bits to enable the independent programmable current sources;
a flip flop to toggle in response to one of the independent programmable current sources being enabled; and
a state machine to automate a test of the distributed logic circuit and to record a result of the test in a status register having a bit for each of the independent programmable current sources.

9. The apparatus of claim 8 wherein the independent programmable current sources utilize PMOS circuits which are biased in saturation.

10. The apparatus of claim 8 wherein the plurality of control bits enable one of the independent programmable current sources that results in a clock output at an output buffer that toggles an output of the flip flop during normal operation of the enabled current source to indicate it is physically connected.

11. The apparatus of claim 8 wherein the distributed logic circuit is either One of a phase interpolator or a DLL coupled to a phase interpolator.

12. An apparatus comprising:
a plurality of delay stages with independent programmable current sources, wherein the independent programmable current sources utilize PMOS circuits which are biased in saturation;
a plurality of control bits to enable the independent programmable current sources;
a flip flop to toggle in response to one of the independent programmable current sources being enabled, wherein the apparatus is to test whether a DLL is producing correct reference edges without loading an output of the DLL to a distributed logic circuit coupled to the output of the DLL.

13. The apparatus of claim 12 wherein the plurality of control bits are to enable one of the independent programmable current sources that results in a clock output at an output buffer that toggles an output of the flip flop during normal operation of the enabled current source to indicate it is physically connected.

14. The apparatus of claim 12 wherein the distributed logic circuit is a phase interpolator.

15. An apparatus comprising:
a plurality of delay states with independent programmable current sources;
a plurality of control bits to enable the independent programmable current sources;
a flip flop to toggle in response to one of the independent programmable current sources being enabled; and
a state machine to automate a test of a distributed logic circuit and to determine whether a DLL is producing correct reference edges without loading an output of the DLL to the distributed logic circuit coupled to the output of the DLL.

16. The apparatus of claim 15 wherein the independent programmable current sources utilize PMOS circuits which are biased in saturation.

17. The apparatus of claim 15 wherein the plurality of control bits enable one of the independent programmable current sources that results in a clock output at an output buffer that toggles an output of the flip flop during normal operation of the enabled current source to indicate it is physically connected.

18. The apparatus of claim 15 wherein the distributed logic circuit is a phase interpolator.

19. A system with a distributed logic circuit comprising:
a dynamic memory, coupled to store data for the system;
a state machine to automate a test of the distributed logic circuit, wherein the state machine is to disable the distributed logic circuit, thereafter enable one leg of the distributed logic circuit; and
determine whether an output of a flip flop has toggled in response to the enabling one leg of the distributed logic circuit.

20. The system of claim 19 wherein the distributed logic circuit comprises independent programmable current sources including PMOS circuits which are biased in saturation.

21. The system of claim 20 wherein a plurality of control bits enable one of the independent programmable current sources that results in a clock output at an output buffer that toggles the output of the flip flop during normal operation of the enabled current source to indicate it is physically connected.

22. The system of claim 19 wherein the distributed logic circuit is a phase interpolator or a DLL coupled to a phase interpolator.

23. The system of claim 22 wherein the distributed logic circuit comprises independent programmable current sources that utilize PMOS circuits which are biased in saturation.

24. A system with a distributed logic circuit comprising:
a dynamic memory to store data for the system;
a plurality of delay states with independent programmable current sources;
a plurality of control bits to enable the independent programmable current sources; and
a flip flop to toggle in response to one of the independent programmable current sources being enabled.

25. The system of claim 24 wherein the independent programmable current sources utilize PMOS circuits which are biased in saturation.

26. The system of claim 24 wherein the plurality of control bits enable one of the Independent programmable current sources that results in a clock output at an output buffer that toggles an output of the flip flop during normal operation of the enabled current source to indicate it is physically connected.

27. The system of claim 24 wherein the distributed logic circuit is a phase interpolator or a DLL coupled to a phase interpolator.

28. A method for testing a plurality of current sources comprising:
disabling the plurality of current sources, wherein disabling the plurality of current sources is done by enabling a plurality of input clocks that results in no current flowing through a plurality of delay cells;
selecting a first clock phase and a second clock phase by enabling one of the plurality of current sources for the selection of the first and second clock phase; and
determining whether an output of a flip flop has toggled in response to the enabling of the one of the plurality of current sources.

29. The method of claim 28 wherein enabling one of the plurality of current sources is done by programming inverse values for a first and second set of control bits.

30. An apparatus to test a distributed logic circuit comprising:
- a plurality of delay states with independent programmable current sources enabled by a plurality of control bits in response to a selection of two clock phases; and
- a flip flop to toggle in response to one of the independent programmable current sources being enabled.

31. The apparatus of claim 30 wherein the independent programmable current sources utilize PMOS circuits which are biased in saturation.

32. The apparatus of claim 30 wherein the plurality of control bits are to enable one of the independent programmable current sources that results in a clock output at an output buffer that toggles an output of the flip flop during normal operation of the enabled current source to indicate it is physically connected.

33. The apparatus of claim 30 wherein the distributed logic circuit is either one of a phase interpolator or a DLL coupled to a phase interpolator.

34. An apparatus to test a distributed logic circuit comprising:
- a plurality of delay states with independent programmable current sources;
- a plurality of control bits to enable the independent programmable current sources in response to a selection of two clock phases;
- a flip flop to toggle in response to one of the independent programmable current sources being enabled; and
- a state machine to automate a test of the distributed logic circuit.

35. The apparatus of claim 34 wherein the independent programmable current sources utilize PMOS circuits which are biased in saturation.

36. The apparatus of claim 34 wherein the plurality of control bits are to enable one of the independent programmable current sources that results in a clock output at an output buffer that toggles an output of the flip flop during normal operation of the enabled current source to indicate it is physically connected.

37. The apparatus of claim 34 wherein the distributed logic circuit is either one of a phase interpolator or a DLL coupled to a phase interpolator.

38. A system with a distributed circuit comprising:
- a dynamic memory to store data for the system;
- the system to disable the distributed circuit;
- the system to enable one leg of the distributed circuit; and
- the system to determine whether an output of a flip flop has toggled in response to the enabling one leg of the distributed circuit.

39. The system of claim 38 wherein the distributed circuit comprises a plurality of independent programmable current sources which utilize PMOS circuits which are biased in saturation.

40. The system of claim 39 wherein the system is to enable one leg of the distributed circuit by a plurality of control bits that enable one of the independent programmable current sources that results in a clock output at an output buffer that toggles an output of the flip flop during normal operation of the enabled current source to indicate it is physically connected.

41. The system of claim 38 wherein the distributed circuit is a phase interpolator or a DLL coupled to a phase interpolator.

42. The system of claim 38 wherein the distributed circuit is either a logic or analog circuit of the following types: a distributed current source, equalizing current mode or voltage mode transmitters, impedance controlled termination or drivers, VOC sense amps.

* * * * *